(12) United States Patent
Lee

(10) Patent No.: US 12,378,110 B2
(45) Date of Patent: Aug. 5, 2025

(54) METHOD OF ATTACHING FILM

(71) Applicant: Advanced Semiconductor Engineering, Inc., Kaohsiung (TW)

(72) Inventor: Chin-Song Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 223 days.

(21) Appl. No.: 17/974,481

(22) Filed: Oct. 26, 2022

(65) Prior Publication Data

US 2024/0140785 A1 May 2, 2024

(51) Int. Cl.
*B81C 1/00* (2006.01)

(52) U.S. Cl.
CPC .................. *B81C 1/00285* (2013.01)

(58) Field of Classification Search
CPC .......... H01L 21/67132; H01L 21/6836; H01L 21/67115; H01L 2221/68327; H01L 2221/6834; B32B 7/06; B32B 7/12; B32B 37/10; B32B 37/26; B32B 38/10; B32B 37/12; B32B 37/18; B32B 38/0008; B32B 2037/268; B32B 2310/0831; B32B 2457/14
See application file for complete search history.

(56) References Cited

U.S. PATENT DOCUMENTS

2018/0350641 A1* 12/2018 Nakamura .............. B32B 38/10

FOREIGN PATENT DOCUMENTS

CN 214852064 U 11/2021

\* cited by examiner

*Primary Examiner* — Abbas Rashid
*Assistant Examiner* — Adrianna N Konves
(74) *Attorney, Agent, or Firm* — FOLEY & LARDNER LLP

(57) ABSTRACT

A method of attaching a film is provided. The method includes providing a carrier tape. The carrier tape supports a film over a surface of the carrier tape. The method further includes moving the film to a position over an electronic device. The method further includes attaching the film to the electronic device.

18 Claims, 14 Drawing Sheets

METHOD OF ATTACHING FILM

BACKGROUND

1. Field of the Disclosure

The present disclosure relates to a method of attaching a film, and particularly to a method of attaching a film to an electronic component.

2. Description of the Related Art

A gas permeable film is attached to an electronic device to allow air or gases to pass through so that the electronic device and detect the change in the external environment. In a conventional method, the gas permeable film is picked up by a suction force and the gas permeable film may be deformed due to the suction force. After attaching the gas permeable film to the electronic device, the upper surface of the film which faces the external environment may contain certain unevenness which adversely affects the adhesion between the film and the electronic device as well as the performance of the electronic device. In order to solve these problems, a new film attaching system and a method of manufacturing a pressure sensor are required.

SUMMARY

In some embodiments, a method of attaching a film includes providing a carrier tape. The carrier tape supports a film over a surface of the carrier tape. The method further includes moving the film to a position over an electronic device. The method further includes attaching the film to the electronic device.

In some embodiments, a method of attaching a film includes: providing a carrier tape with a film over a first surface of the carrier tape, wherein the carrier tape is configured to transport the film to a position over the electronic device; and separating the film from the carrier tape.

In some embodiments, a method of attaching a film includes: providing a carrier tape having a first surface over which a plurality of films are disposed; providing a plurality of electronic devices, each of which corresponds to one of the plurality of films; and reducing a first distance between a first film of the plurality of films and a corresponding first electronic device of the plurality of electronic devices.

In some embodiments, a method of manufacturing a package structure includes providing a film transfer assembly. The film transfer assembly includes a carrier tape having a first surface and a second surface opposite to the first surface. A film is on the first surface of the carrier tape. The method also includes providing an electronic device. The method further includes facing the electronic device towards the film. In addition, the method includes applying a pressure on the second surface of the carrier tape to attach the film to the electronic device.

In some embodiments, a method of manufacturing a package structure includes providing a film transfer assembly. The film transfer assembly includes a carrier tape having a first surface and a second surface opposite to the first surface. A film is on the first surface of the carrier tape. The method also includes providing an electronic device on a base assembly. The method further includes aligning the electronic device with the film in a vertical direction. In addition, the method includes releasing the film from the film transfer assembly after the film is attached to the electronic device.

In some embodiments, a package structure includes an electronic device and a gas permeable film. The gas permeable film includes a gas permeable region and an attachment region. The attachment region has an upper surface and a lower surface opposite to the upper surface. The lower surface of the attachment region of the gas permeable film is attached to an upper surface of the electronic device and the upper surface of the attachment region of the gas permeable film is substantially flat.

In some embodiments, a film attaching system includes a base assembly, a film transfer assembly, and a film attaching assembly. The base assembly is configured to support and transport an electronic device. The film transfer assembly is configured to transport a carrier tape with a film disposed over a first surface of the carrier tape. The film attaching assembly is configured to apply pressure on a second surface opposite to the first surface of the carrier tape to attach the film to the electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
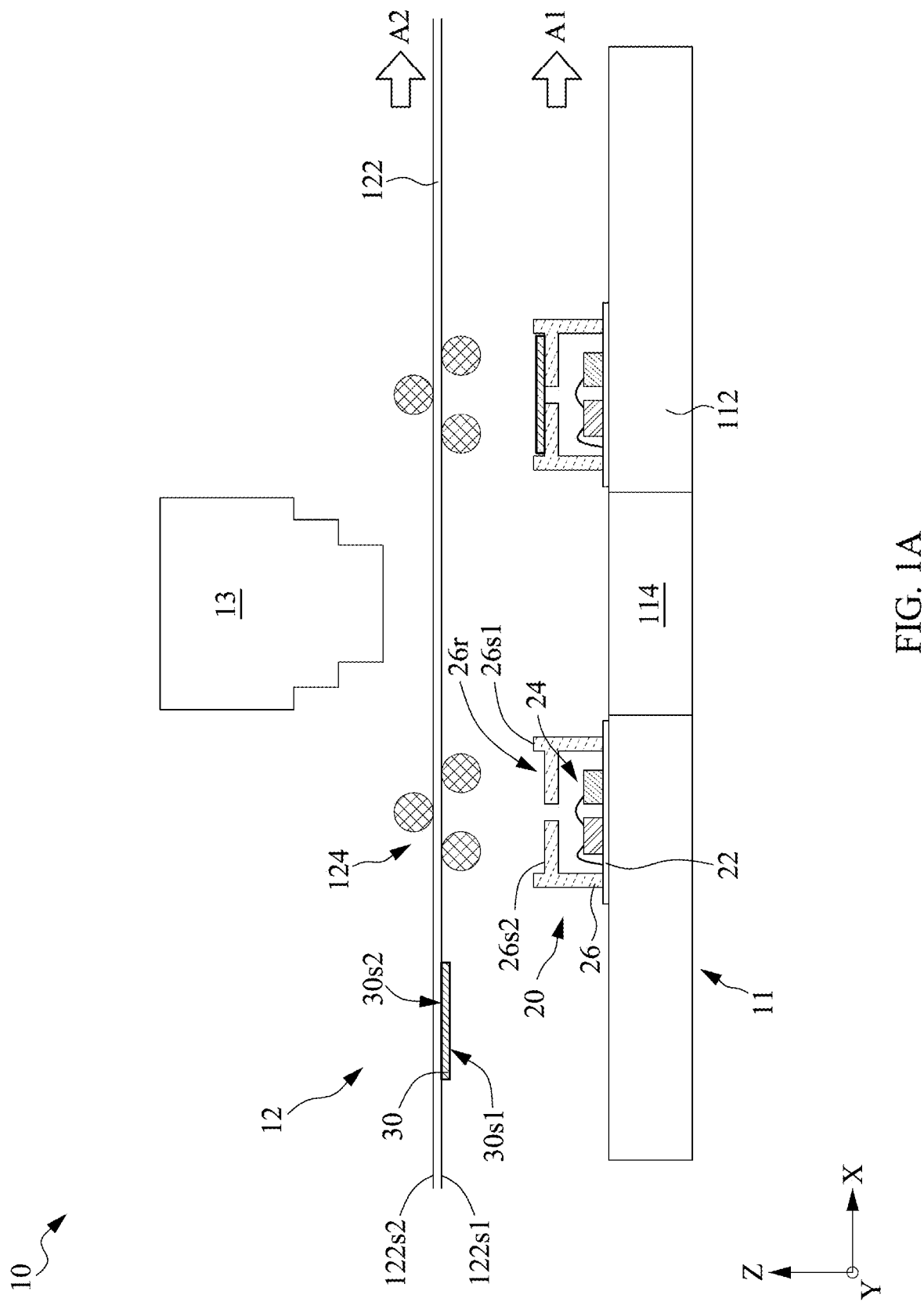
FIG. 1A, FIG. 1B, FIG. 2, FIG. 3, FIG. 4, FIG. 5, FIG. 6 and FIG. 7 illustrate various stages of an example of a method for attaching a film or manufacturing a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein the term "active surface" may refer to a surface of an electronic component or passive element on which contact terminals such as contact pads are disposed. The term "active surface" may also refer to a surface of a photonic component along which a waveguide is disposed, and the waveguide may be disposed adjacent to the active surface.

FIG. 1A, FIG. 1B, FIG. 2, FIG. 3, FIG. 4, FIG. 5, FIG. 6 and FIG. 7 illustrate various stages of an example of a method for attaching a film according to some embodiments of the present disclosure. The method may be applicable to, for example, manufacture a package structure with a film (e.g., a gas permeable film) attached to an electronic device (e.g., a pressure sensor, a gas sensor, a humidity sensor, a temperature sensor, or a combination thereof).

The method may begin with a stage shown in FIG. 1A. A film attaching system 10 may be provided. In some embodiments, the film attaching system 10 may include a base assembly 11, a film transfer assembly 12, and a film attaching assembly 13. It should be noted that the film attaching system 10 may include more assemblies based on requirements. In some embodiments, each of the base assembly 11, film transfer assembly 12, and/or film attaching assembly 13 may operate independently. For example, each of the base assembly 11, film transfer assembly 12, and/or film attaching assembly 13 may move along a vertical direction or a horizontal direction independently without affecting the movement of other assemblies.

The base assembly 11 may be configured to support electronic devices 20 and transfer the electronic devices 20 horizontally and/or vertically. In some embodiments, the base assembly 11 may include a base 112 and a liftable plate 114. In some embodiments, the base assembly 11 may have a sliding plane (e.g., the upper surface of the base assembly 11) and a conveyor belt(s) (not shown) arranged in slidable contact with the sliding plane over the base 112 and the liftable plate 114. The electronic device 20 may be disposed on the sliding plane of the base assembly 11 and transported in the horizontal direction (e.g., the X direction), indicated by the arrow A1 shown in FIG. 1A, by the operation of the conveyor belt. In other embodiments, the electronic devices 20 may be transported along the Y direction.

Figure 1B:
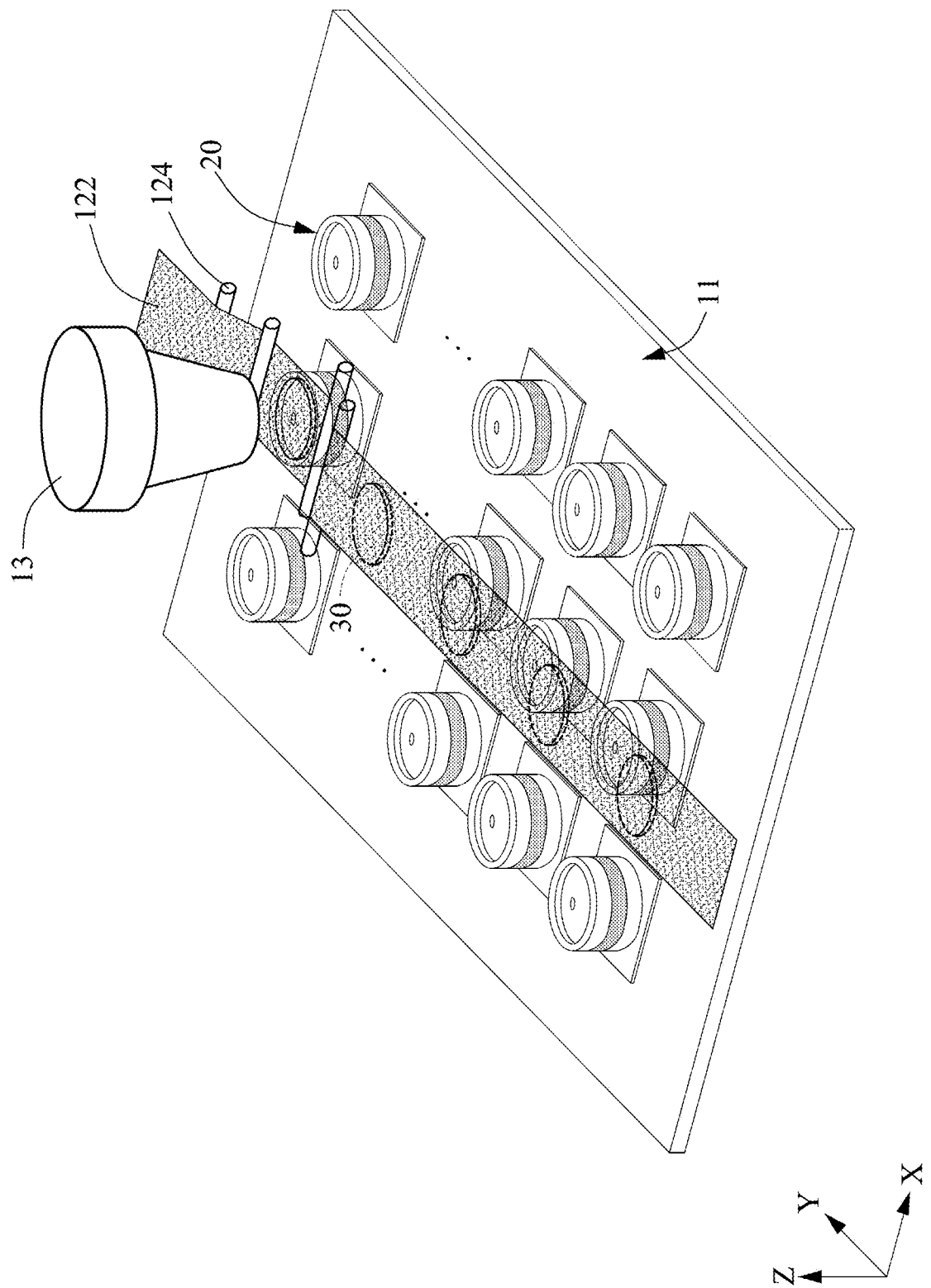

In other embodiments as shown in FIG. 1B, the electronic devices 20 may be arranged in a two-dimensional array, and the base assembly 11 may be configured to transfer the electronic devices 20 along the X direction and/or the Y direction. In some embodiments, the electronic devices 20 are disposed on a tape (or a conveyor belt). The tape may be fixed on a frame of the base assembly 11 and move together with the frame along the X direction and/or the Y direction. The tape may be configured to transfer the electronic devices 20 along the X direction and/or the Y direction. The tape may be flexible.

The base 112 may be configured to support a plurality of electronic devices 20. The electronic device 20 may be transported horizontally over the base 112. In some embodiments, the liftable plate 114 may be configured to move the electronic device 20 vertically (e.g., in the Z direction) or move the electronic device 20 toward the film transfer assembly 12. The liftable plate 114 is liftable vertically to approach the electronic device 20 and the film transfer assembly 12, which thereby reduces a vertical distance (or a gap along the Z direction) between the electronic device 20 and the film transfer assembly 12.

The film transfer assembly 12 may be configured to transport a film horizontally and/or vertically. In some embodiments, the film transfer assembly 12 may be configured to transport a carrier tape 122 with a plurality of films disposed on a surface of the carrier tape. The film transfer assembly 12 may include a plurality of rollers 124, and other suitable components based on requirements.

The carrier tape 122 may be configured to support a film 30 (or a plurality of films 30). The carrier tape 122 may be configured to carry and transport a film 30 (or a plurality of films 30) horizontally. The carrier tape 122 may have a surface 122s1 and a surface 122s2. The surface 122s1 may face the base assembly 11. The surface 122s2 may be opposite to the surface 122s1. The film (or a plurality of films 30) may be disposed over or on the surface 122s1 of the carrier tape 122. The film 30 (or the plurality of films 30) may be supported by the surface 122s1 of the carrier tape 122. The film 30 (or the plurality of films 30) may be attached to the surface 122s1 of the carrier tape 122. In some embodiments, the film 30 may be transported in the horizontal direction, indicated by the arrow A2 shown in FIG. 1A, by the carrier tape 122. In some embodiments, the carrier tape 122 and the film(s) disposed thereon, as a whole, are fed into the rollers of the film transfer assembly 12 and transported in a horizontal direction by the operation of the rollers. In some embodiments, the carrier tape 122 is a part of the film transfer assembly 12 and the film(s) are disposed on a surface of the carrier tape 122 so that the film(s) can be transported via the movement of the carrier tape 122 due to the operation of the rollers.

The rollers (or "roller assembly") 124 may include a plurality of rollers in the form of a cylinder, but is not limited thereto. The roller assembly 124 may rotate clockwise and/or counterclockwise so that the carrier tape 122 may move along the horizontal direction. In addition, the roller assembly 124 may move upwardly or downwardly.

The film attaching assembly 13 may be configured to apply pressure to attach the film 30 to the electronic device 20. In some embodiments, the film attaching assembly 13 may be configured to apply pressure on the surface 122s2 of the carrier tape 122 to attach the film 30 to the electronic device 20. In some embodiments, the film attaching assembly 13 may be vertically aligned with the liftable plate 114 of the base assembly 11. In some embodiments, the film attaching assembly 13 may move vertically, which thereby forces the film 30 to be attached to the electronic device 20.

A plurality of electronic devices 20 may be disposed on the sliding plane of the base assembly 11. The electronic device 20 may face the film transfer assembly 12 or the film attaching assembly 13. The electronic device 20 may include a carrier 22, an electronic component(s) 24, and a lid 26.

The carrier 22 may be configured to support the electronic component 24 and the lid 26. The carrier 22 may include, for example, a circuit board or other suitable substrates.

The electronic component(s) 24 may be disposed on the carrier 22. The electronic component(s) 24 may be electrically connected to the carrier 22. In some embodiments, the electronic component(s) 24 may include at least one chip. Each of the chips may include, for example, an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC. In some embodiments, the electronic component 24 may be configured to serve as a sensing component, such as a pressure sensor, a gas sensor, a humidity sensor, a temperature sensor, or a combination thereof. In some embodiments, the electronic component 24 may be configured to communicate with an external environment. In some embodiments, the electronic component 24 may be configured to sense pressure change (or humidity change or temperature change) of an external environment. In some embodiments, the electronic device 20 may further include a bonding wire (not annotated) or other suitable electrical connections. The electronic device 20 may further include an encapsulant or an underfill at least partially encapsulating the electronic component 24.

The lid 26 may be disposed on the carrier 22. In some embodiments, the lid 26 may cover or encapsulate the electronic component 24. In some embodiments, the lid 26 define an inner space together with the carrier 22 for accommodating the electronic component 24. In some embodiments, the lid 26 may define an opening (or an aperture), which communicates the inner space with an external environment. The lid may include a surface $26s1$ and a surface $26s2$. The surface $26s2$ may be recessed from the surface $26s1$. The surface $26s1$, surface $26s2$, and both may be referred to as an upper surface of the electronic device 20. The lid 26 may define a recess $26r$ recessed from the surface $26s1$ of the lid 26. The surface $26s2$ may serve as a bottom of the recess $26r$. The recess $26r$ of the lid 26 may be configured to accommodate the film 30. In some embodiments, the opening of the lid locates in the recess $26r$ of the lid 26.

In some embodiments, the film 30 may be configured to cover the opening defined by the lid 26. Each of the films 30 may be configured to be attached to a corresponding electronic device 20. In some embodiments, the film 30 may be or include a gas permeable film, which allows gas (e.g., air or other gases) to pass through. The film 30 may have a surface (or a side) $30s1$ and a surface $30s2$ (or a side) opposite to the surface $30s1$. The surface $30s1$ of the film 30 may be configured to be attached to the electronic device 20. The surface $30s2$ of the film 30 may be configured to be attached to the carrier tape 122. In some embodiments, the adhesion of the surface $30s1$ of the film 30 (i.e, the adhesion between the surface $30s1$ of the film 30 and the electronic device 20) may be greater than the adhesion of the surface $30s2$ of the film 30 (i.e., the adhesion between the surface $30s2$ of the film 30 and the carrier tape 122).

Figure 2:
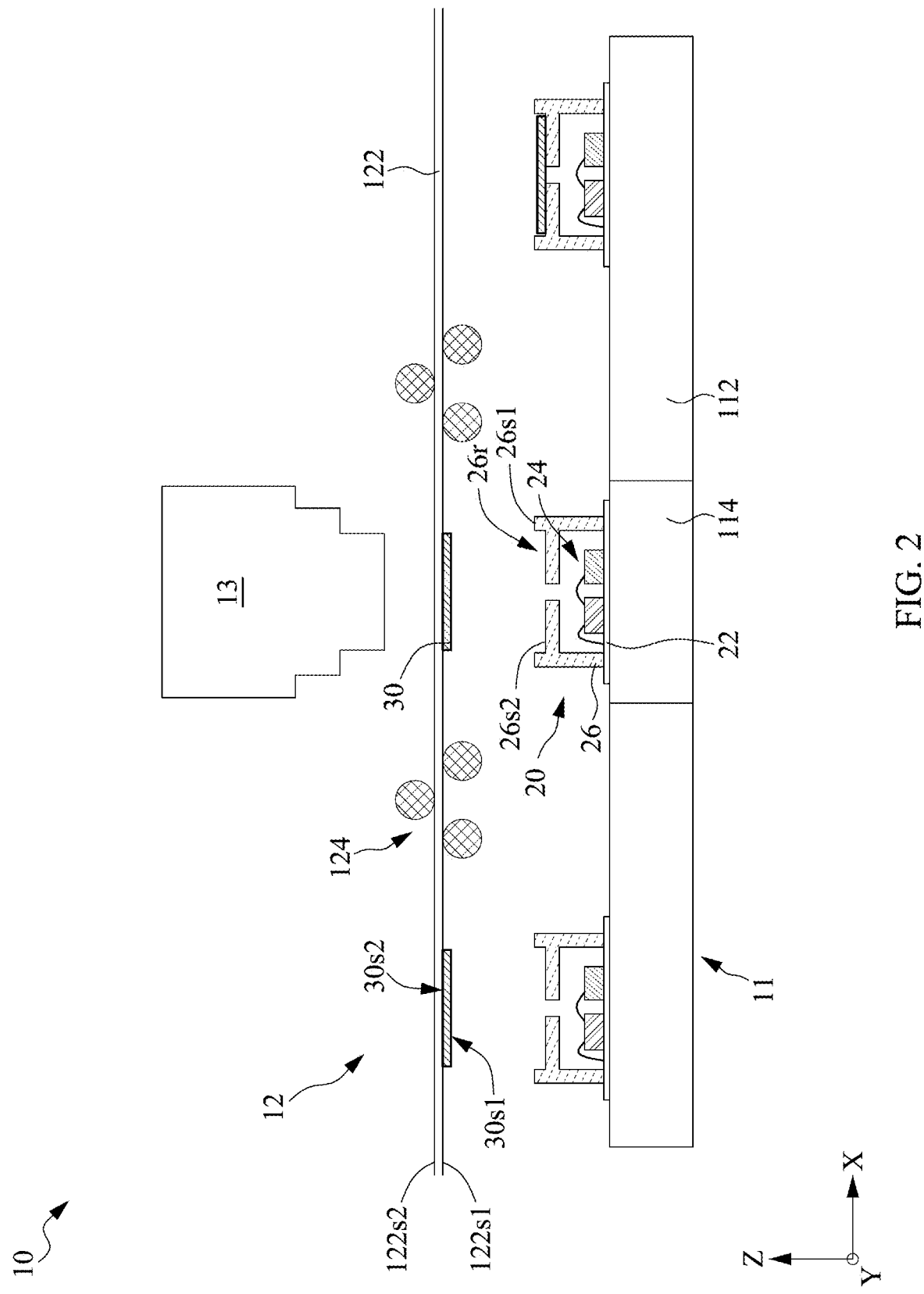

Referring to FIG. 2, one of the electronic devices 20 may be transported to the liftable plate 114 of the base assembly 11. One of the films 30 may be transported to a position directly above the electronic device 20 to align with the electronic device 20 in a vertical direction by an alignment module (not shown). In some embodiments, the electronic device 20 has a recess on an upper surface and the film 30 is aligned with the recess. In some embodiments, an image sensor, such as a charge-coupled device (CCD) camera, may be signally coupled to the alignment module and obtain position information of the electronic device 20 and the film 30. The alignment module may instruct the base assembly 11 (e.g., the liftable plate 114) and/or the film transfer assembly 12 based on the position information provided by the image sensor. The alignment module may be configured to determine whether the electronic device 20 and/or the film 30 moves horizontally based on the position information. When a position deviation between the electronic device 20 and the film 30 is equal to or less than a predetermined value, the alignment module may instruct the base assembly 11 and/or the film transfer assembly 12 to stop the horizontal movement of the electronic device 20 and/or the film 30.

Figure 3:
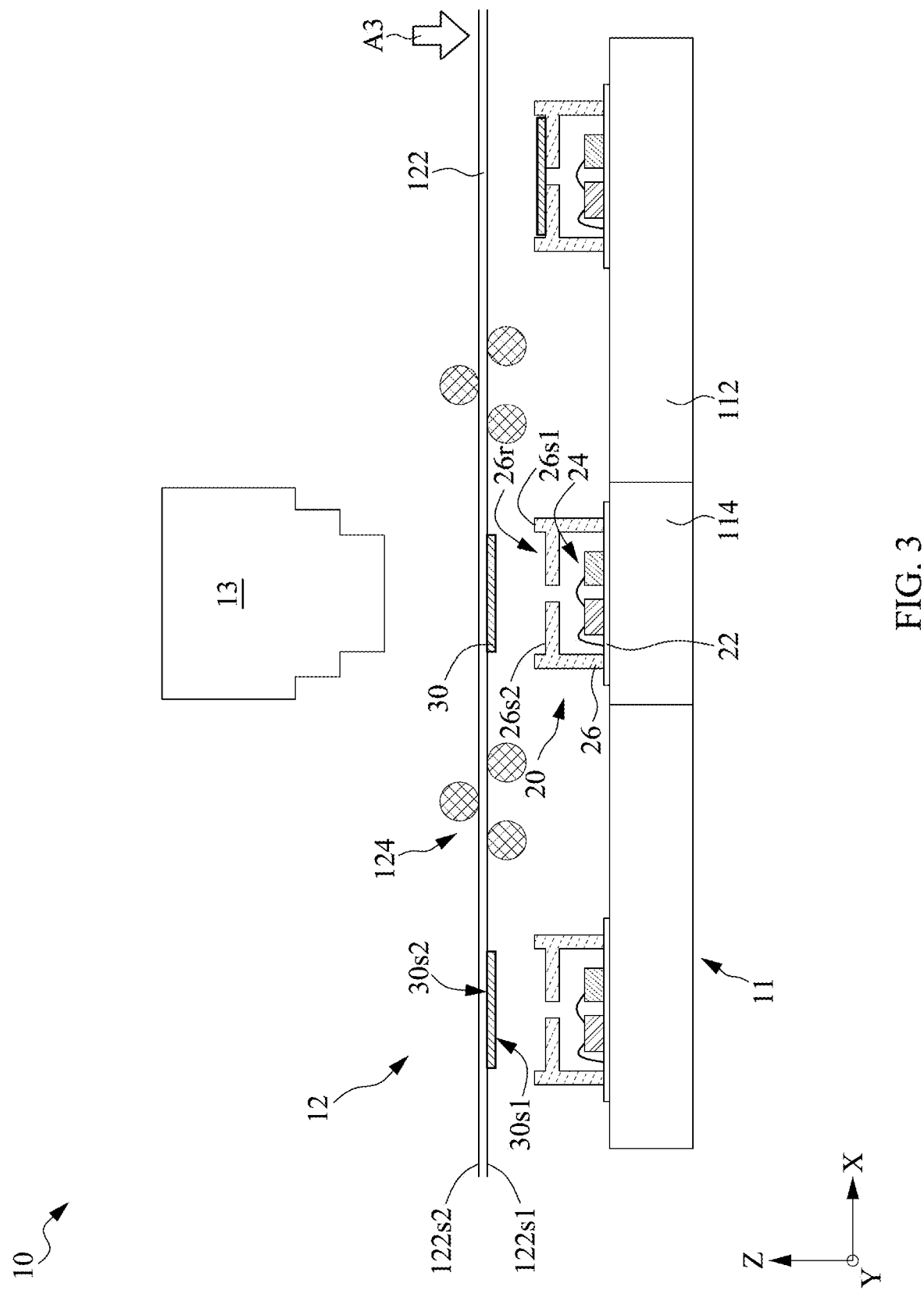

Referring to FIG. 3, the film transfer assembly 12 may be moved in the vertical direction, indicated by the arrow A3 shown in FIG. 3. In some embodiments, the film transfer assembly 12 may be moved toward the electronic device 20 to reduce a vertical distance (or a gap) between the electronic device 20 and the film 30. A motor unit (not shown) may be configured to move the film transfer assembly 12 vertically. In some embodiments, in this stage, the roller assembly 124 may be moved toward the base assembly 11. In some embodiments, in this stage, the carrier tape 122 may be moved toward the base assembly 11. When a vertical distance between the electronic device 20 and the film 30, or a vertical distance between the base assembly 11 and the film transfer assembly 12, is equal to or less than a predetermined value, the film transfer assembly 12 may stop the vertical movement.

The movement of the base assembly 11 and/or the film transfer assembly 12 illustrated in FIG. 2 and FIG. 3 can be carried out one or more times and in any suitable order.

Figure 4:
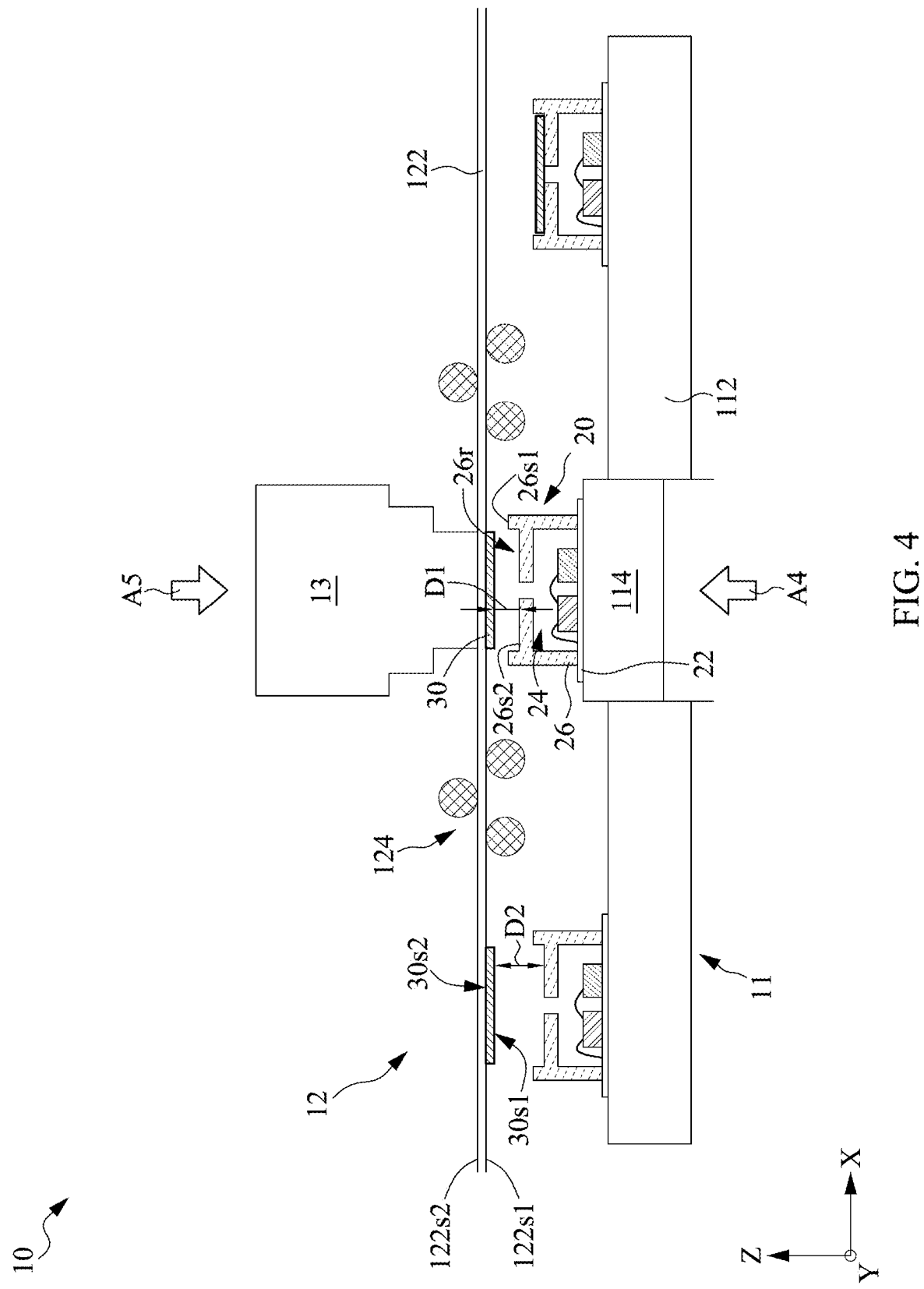

Referring to FIG. 4, the liftable plate 114 may be moved in the vertical direction, indicated by the arrow A4 shown in FIG. 4. In some embodiments, the electronic device 20 may be moved toward the film 30. In other embodiments, the liftable plate 114 may be stopped when a distance (e.g., the distance D1) between the electronic device 20 and the film 30 is equal to or less than a predetermined value. That is, the liftable plate 114 may be stopped when the lid 26 of the electronic devices 20 is still spaced apart from the film 30. The film attaching assembly 13 may be moved in the vertical direction, indicated by the arrow A5 shown in FIG. 4. A driving unit (not shown) may be configured to drive the film attaching assembly 13 to move vertically. In some embodiments, the film attaching assembly 13 may be moved vertically to be in contact with the carrier tape 122. In other embodiments, the film attaching assembly 13 may be stopped when a distance between the film attaching assembly 13 and the film 30 is equal to or less than a predetermined value. The film 30 may be spaced apart from the electronic device 20 at the stage as shown in FIG. 4. The film 30 may not fill in the recess $26r$ at the stage as shown in FIG. 4. The film 30 may not be in contact with the surface $26s2$ of the lid 26 at the stage as shown in FIG. 4. The film 30 may be spaced apart from the surface $26s2$ of the lid 26 at the stage as shown in FIG. 4. The surface $122s1$ of the carrier tape 122 is closer to the surface $26s1$ of the lid 26. The carrier tape 122 may have a relatively large tension so that the swaying of the carrier tape 122 can be mitigated. In some embodiments, the liftable plate 114 and the film transfer assembly 12 may move simultaneously, which improves the cycle time. In some embodiments, the liftable plate 114 and the film transfer assembly 12 may move individually. For example, the film attaching assembly 13 may move vertically after the liftable plate 114 stops the vertical movement. At this stage, the electronic device 20 over the liftable plate 114 may be located at an elevation different from other electronic devices 20. In this embodiment, the electronic device 20 over the liftable plate 114 is located at an elevation higher than other electronic devices 20 to prevent other electronic devices 20 from being contact with the film 30 and/or the carrier tape 122. The distance D1 between the electronic device 20 over the liftable plate 114 and the film 30 may be different from the distance D2 between one of other electronic devices 20 and the film 30. In this embodiment, the vertical movement of the liftable plate 114 may provide the electronic device 20 with a supporting force to prevent the base assembly 11 from being depressed during the vertical movement of the film attaching assembly 13.

In some embodiments, the alignment operation between the electronic device 20 and the film 30 is performed before the vertical movement of the liftable plate 114, which can prevent the film 30 from being got stuck in the liftable plate 114 or the friction between the tape of the base assembly 11 and the liftable plate 114.

Figure 5:
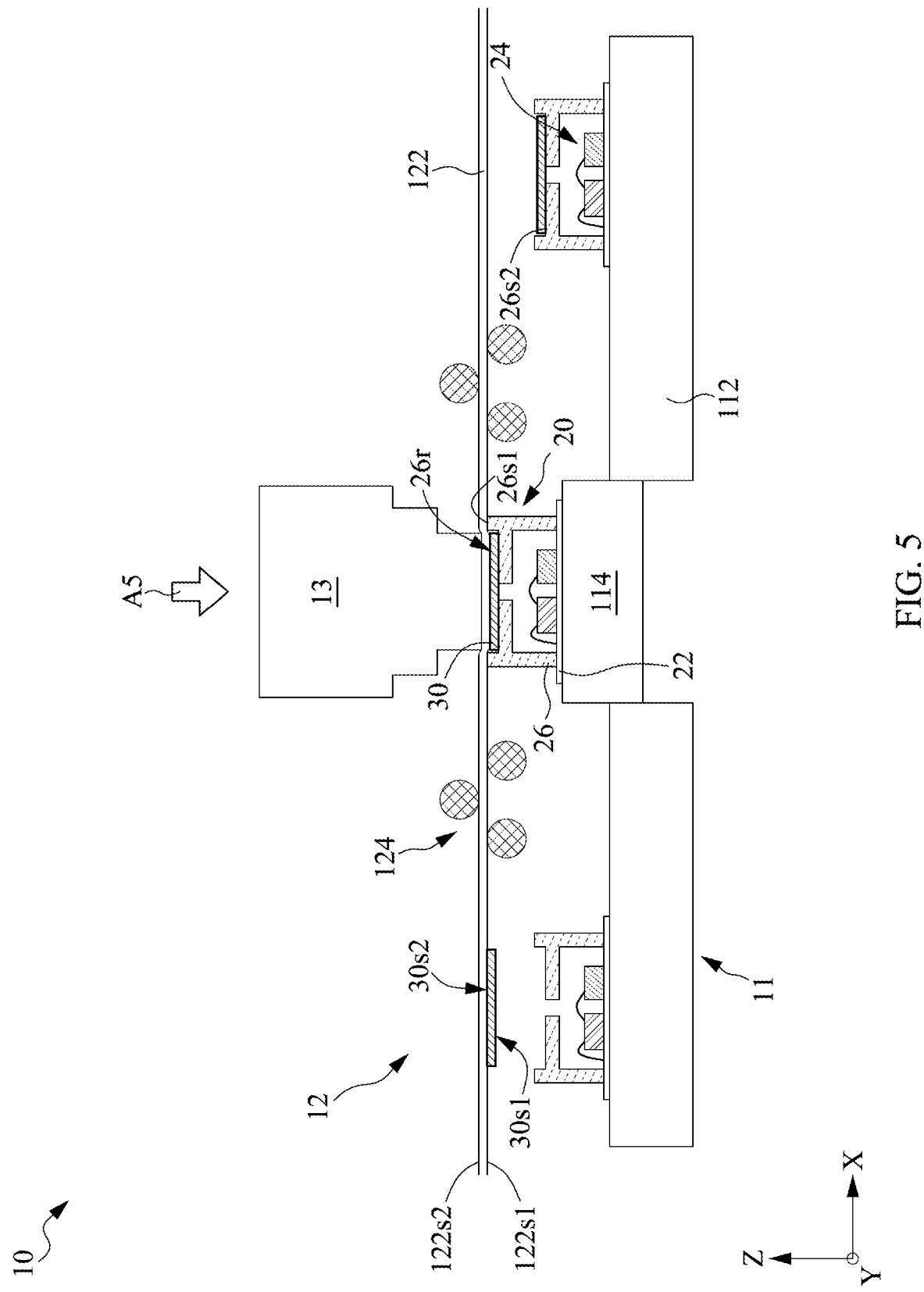

Referring to FIG. 5, after the liftable plate 114 stops the vertical movement, the film attaching assembly 13 may continue to be moved in the vertical direction, indicated by the arrow A5 shown in FIG. 5, to apply a pressure on the film 30 until the film 30 contacts the lid 26 (e.g., the surface 26s2 of the recess 26r). As a result, the film is attached to the upper surface (e.g, surface 26s2) of the electronic device. In some embodiment, the film attaching assembly 13 may be further moved downwardly in the vertical direction indicated by the arrow A5 to apply more pressure and to enhance the adhesion between the film 30 and the electronic device 20. In some embodiments, the film attaching assembly 13 can apply heat to the film 30 when attaching the film 30 to the electronic device 20. In some embodiments, the carrier tape 122 is filled into the recess 26r when or after the film 30 is attached to the electronic device 20. In some embodiments, the carrier tape 122 may be in contact with the lid 26 when or after the film attaching assembly 13 applies the pressure on the carrier tape 122. The electronic device 20 may provide the film 30 with a supporting force. The supporting force and the pressure are collectively configured to compress the film 30.

Figure 6:
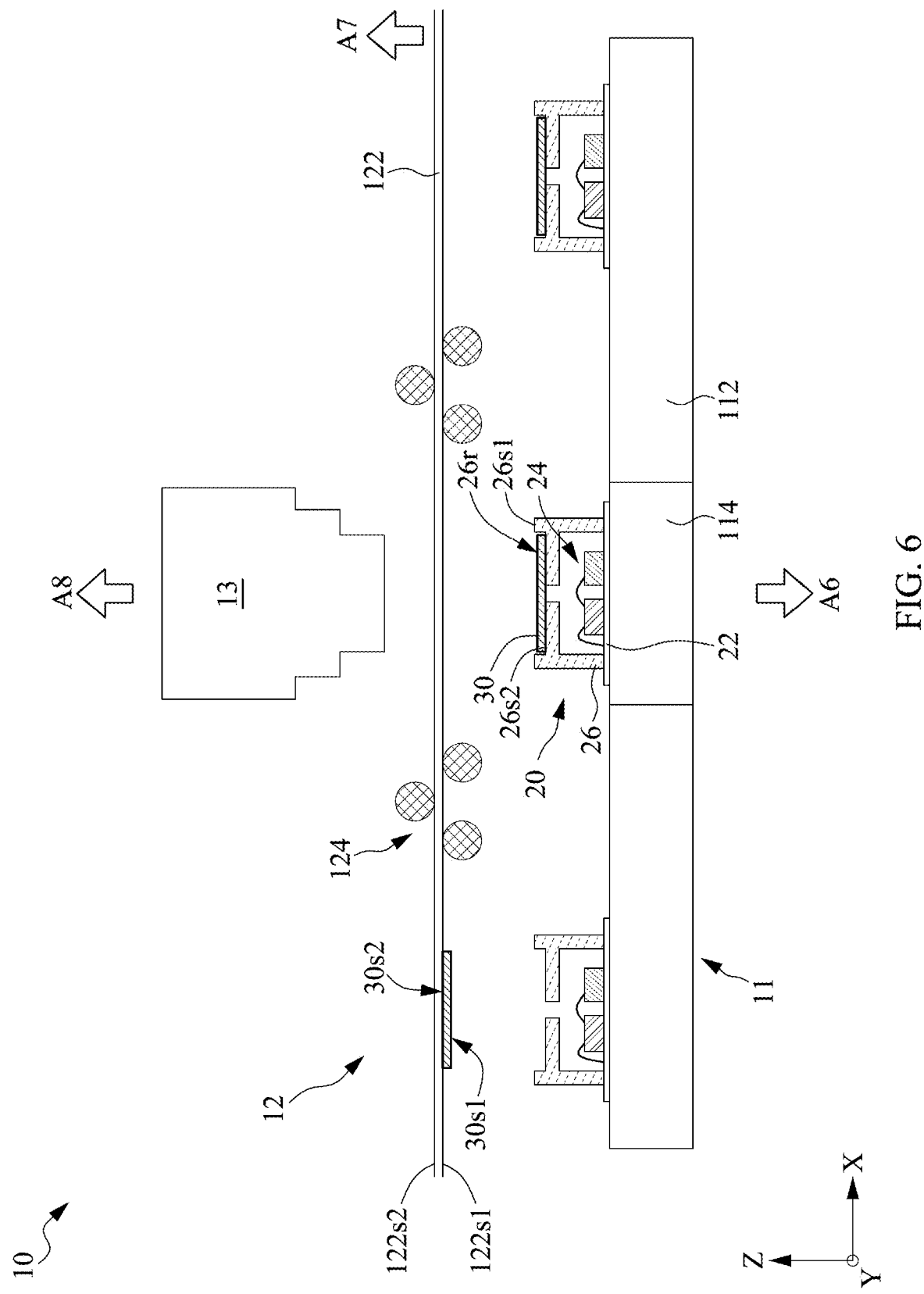

Referring to FIG. 6, when or after the film is attached to the electronic device, the film attaching assembly 13 may stop to apply the pressure on the film 30. The film attaching assembly 13 may be moved in the vertical direction, indicated by the arrow A8. In some embodiments, the film attaching assembly 13 may be moved away from the film transfer assembly 12 and/or the base assembly 11. The liftable plate 114 may be moved in the vertical direction, indicated by the arrow A6 shown in FIG. 6. In some embodiments, the electronic device 20 may be moved away from the film transfer assembly 12. In some embodiments, the film transfer assembly 12 may be moved in the vertical direction, indicated by the arrow A7 shown in FIG. 6. In some embodiments, the film transfer assembly 12 may be moved away from the electronic device 20 and/or the base assembly 11 and the film 30 may be released from the film transfer assembly 12. The film 30 may be spaced apart from the carrier tape 122. The film 30 may be delaminated from the carrier tape 122. The film 30 may be separated from the carrier tape 122 after applying the pressure on the film 30 is stopped. When or after the film attaching assembly 13 is moved in the vertical direction, indicated by the arrow A8 shown in FIG. 6, applying the pressure on the film 30 is stopped. When or after the liftable plate 114 is moved in the vertical direction, indicated by the arrow A6 shown in FIG. 6, applying the pressure on the film 30 is stopped. After the liftable plate 114 returns to the vertical position as shown in FIG. 3, the liftable plate 114 may stop the vertical movement. After the film transfer assembly 12 returns to the vertical position as shown in FIG. 2, the film transfer assembly 12 may stop the vertical movement. After the film attaching assembly 13 returns to the vertical position as shown in FIG. 3, the film attaching assembly 13 may stop the vertical movement.

Figure 7:
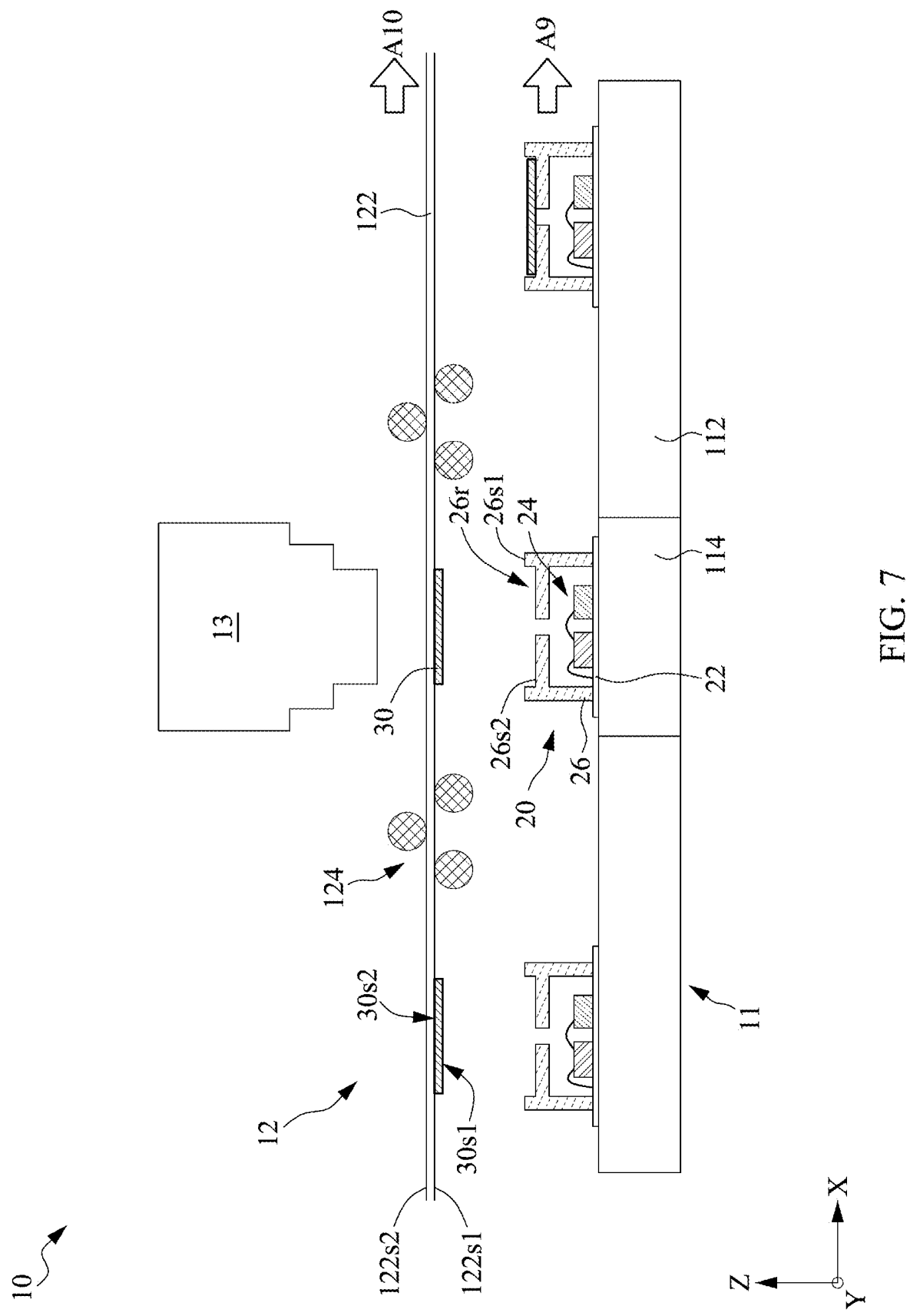

Referring to FIG. 7, a further electronic device 20 may be transported in the horizontal direction, indicated by the arrow A9 shown in FIG. 7. A further film 30 may be transported in the horizontal direction, indicated by the arrow A10 shown in FIG. 7 to align with the further electronic device 20. The cycle of manufacturing processes, as shown in FIG. 1A to FIG. 6, may be repeated.

Figure 8A:
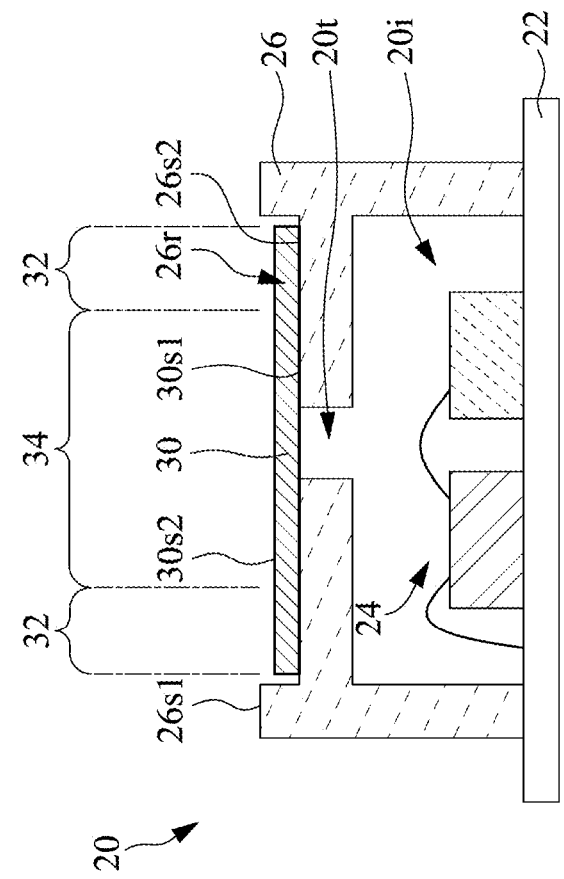
FIG. 8A illustrates a cross-sectional view of a package structure.

FIG. 8A illustrates a cross-sectional view of a package structure 2. In some embodiments, the package structure 2 may be produced by manufacturing processes as shown in FIG. 1A to FIG. 7. In some embodiments, the package structure 2 may include the electronic device 20 and the film 30.

As shown in FIG. 8A, the electronic component 24 may be disposed on the carrier 22 and located within the inner space 20i defined by the lid 26 and the carrier 22. The opening 20t (or aperture) may be defined by the lid 26. In some embodiments, the opening 20t may located on an upper surface of the lid 26. The opening 20t may be connected to the inner space 20i, thereby communicating the inner space 20i and external environment.

In some embodiments, the film 30 may be located within the recess 26r recessed from the surface 26s1 of the lid 26. In some embodiments, the film 30 may be in contact with the surface 26s2 of the lid 26. The film 30 may cover the opening 20t. The film 30 may have a surface 30s1 and a surface 30s2 opposite to the surface 30s1. The surface 30s1 may be attached to the upper surface (not annotated) of the electronic device 20 (i.e., the upper surface of the lid 26). In some embodiments, the film 30 is attached to the upper surface of the lid 26 in the recess.

Figure 8B:
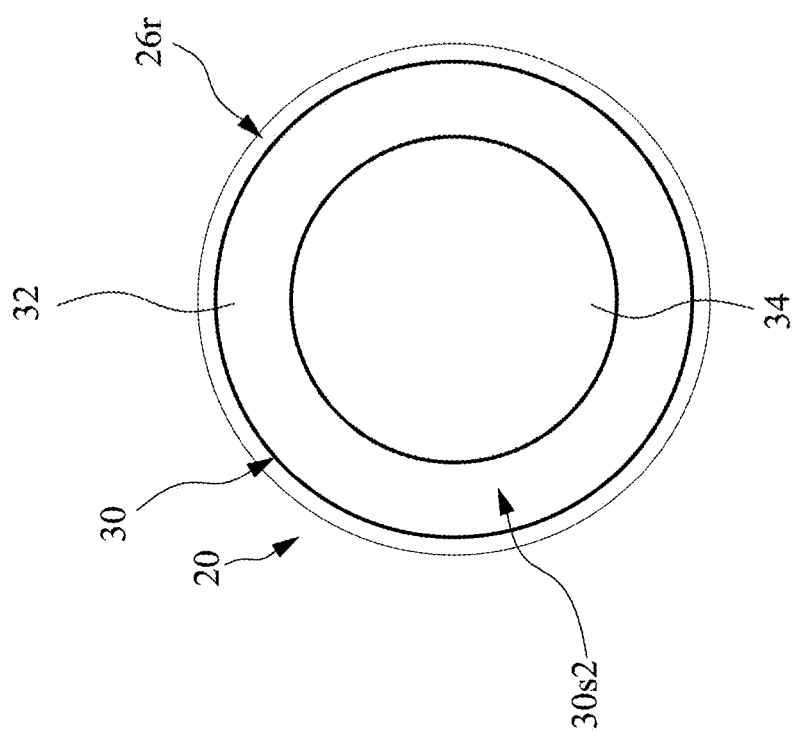
FIG. 8B is a top view of the package structure as shown in FIG. 8A.

FIG. 8B is a top view of the package structure 2 as shown in FIG. 8A. In some embodiments, the film 30 may include an attachment region 32 (or a first region) and a gas permeable region 34 (or a second region). In some embodiments, the attachment region 32 may surround the gas permeable region 34. In some embodiments, the gas permeable region 34 may overlap the opening 20t (shown in FIG. 8A) from the top view. The attachment region 32 may be attached to and/or fixed to the upper surface of the electronic device 20. The gas permeable region 34 may overlaps an aperture of the electronic device. The gas permeable region 34 may be configured to allow gas (e.g., air or other gases) to pass through.

In some embodiments, the surface 30s2 of the film 30 may be substantially flat. For example, the upper surface of the attachment region 32 may be substantially flat. In some embodiments, no voids or air gaps are generated between the surface 30s2 of the film 30 and the upper surface of the electronic device. In some embodiments, no voids or air gaps are generated in the attachment region 32. In some embodiments, no voids or air gaps are generated between the upper surface and the lower surface of the attachment region 32. In the embodiments of the present disclosure, the film 30 is released from the film transfer assembly 12 after the film 30 is attached to the electronic device 20, which may prevent voids and/or air gaps from being generated between the film 30 and the electronic device 20. Undesired voids and/or air gaps may cause the failure of film attachment. Since the package structure of the present disclosure contain less voids or air gaps resulted from the manufacturing processes, the package structure 2 may have a relatively better reliability and performance in comparison with a comparative example.

Figure 9A:
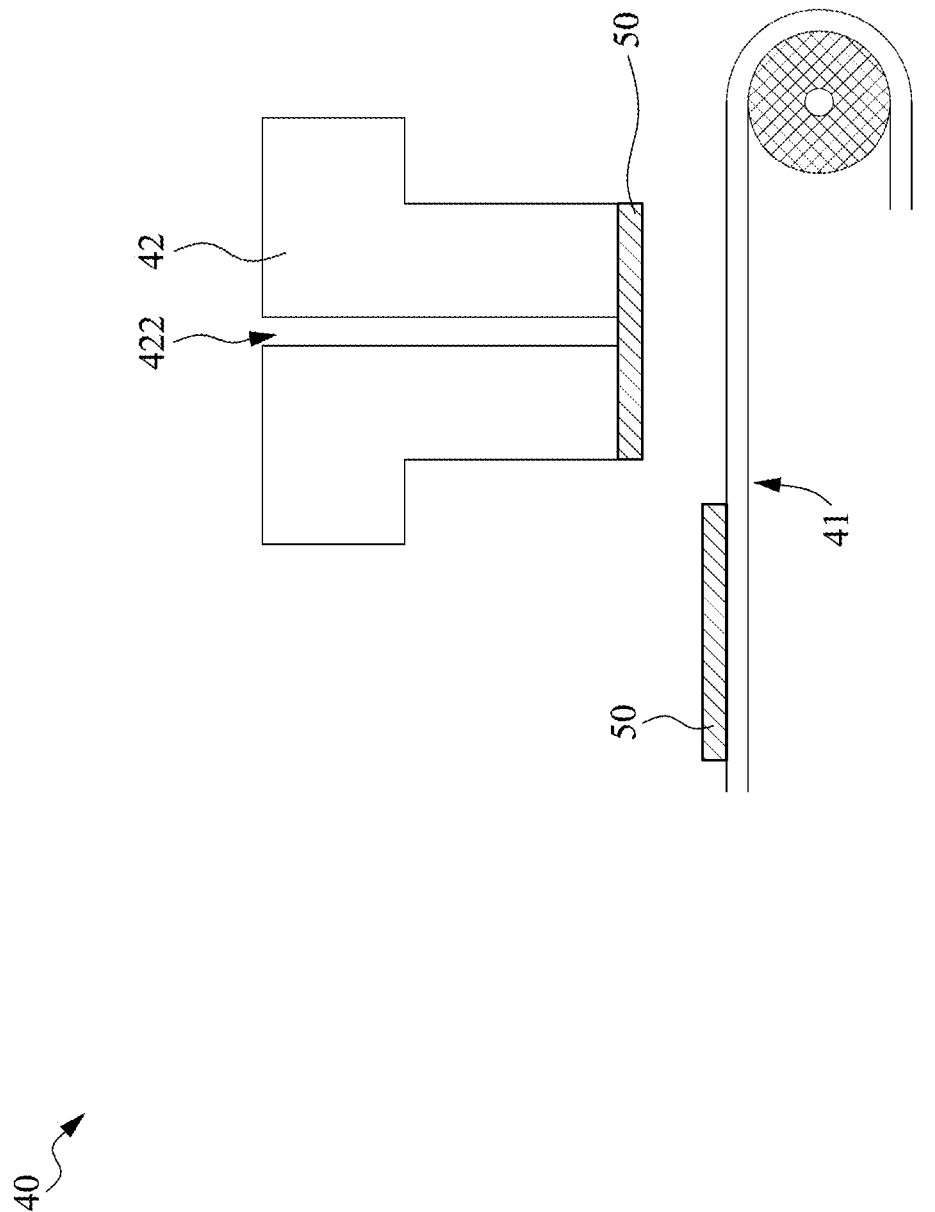
FIGS. 9A and 9B illustrate various stages of an example of a comparative method for attaching a film or manufacturing a package structure.
Figure 9B:
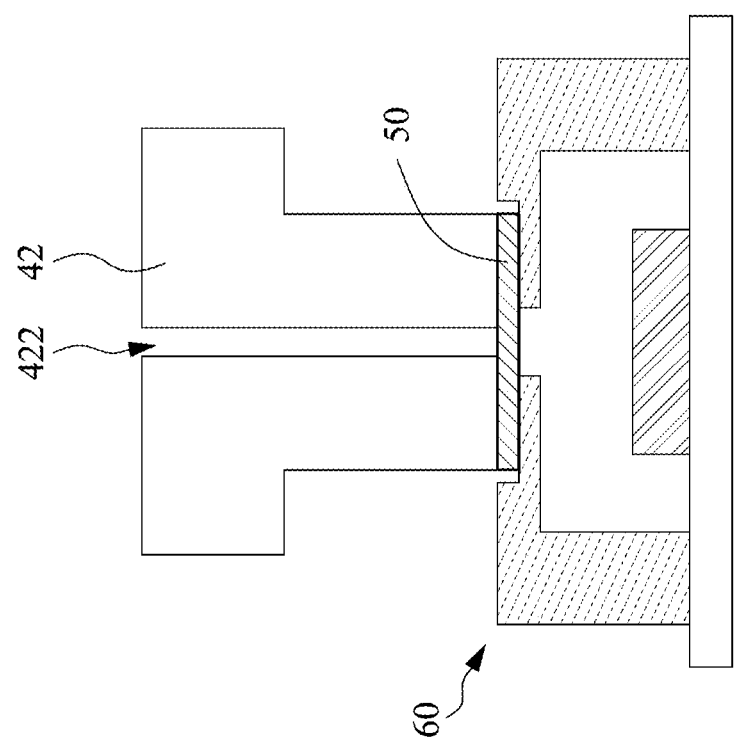

FIGS. 9A and 9B illustrate various stages of an example of a comparative method for attaching a film or manufacturing a package structure.

Referring to FIG. 9A, a comparative system 40 may be provided. The comparative system 40 may include a film transfer assembly 41 and a film attaching assembly 42. The film transfer assembly 41 may be configured to transport a film 50 (e.g., a gas permeable film). In some embodiments, the films are provided on a carrier tape and transported by the movement of the carrier tape driven by the rotation of the roller of the film transfer assembly 41. The film attaching assembly 42 may be configured to pick up the film 50. The film attaching assembly 42 may include a vacuum conduit 422, which is configured to generate a suction force, thereby picking up the film 50. In some embodiments, the vacuum conduit 422 locates at the center of the film attaching assembly 42. In other embodiments, the vacuum conduit(s) 422 may be arranged around the peripheral of the film attaching assembly 42.

Referring to FIG. 9B, the film 50 may be transported to the upper surface of an electronic device 60 (e.g., a pressure sensor) and attached to the electronic device 60 under the pressure applied by the film attaching assembly 42. After film attachment, the film 50 may be released from the film attaching assembly 42 by moving the film attaching assembly 42 in a direction away from the film 50 and a package structure is obtained.

Figure 10:
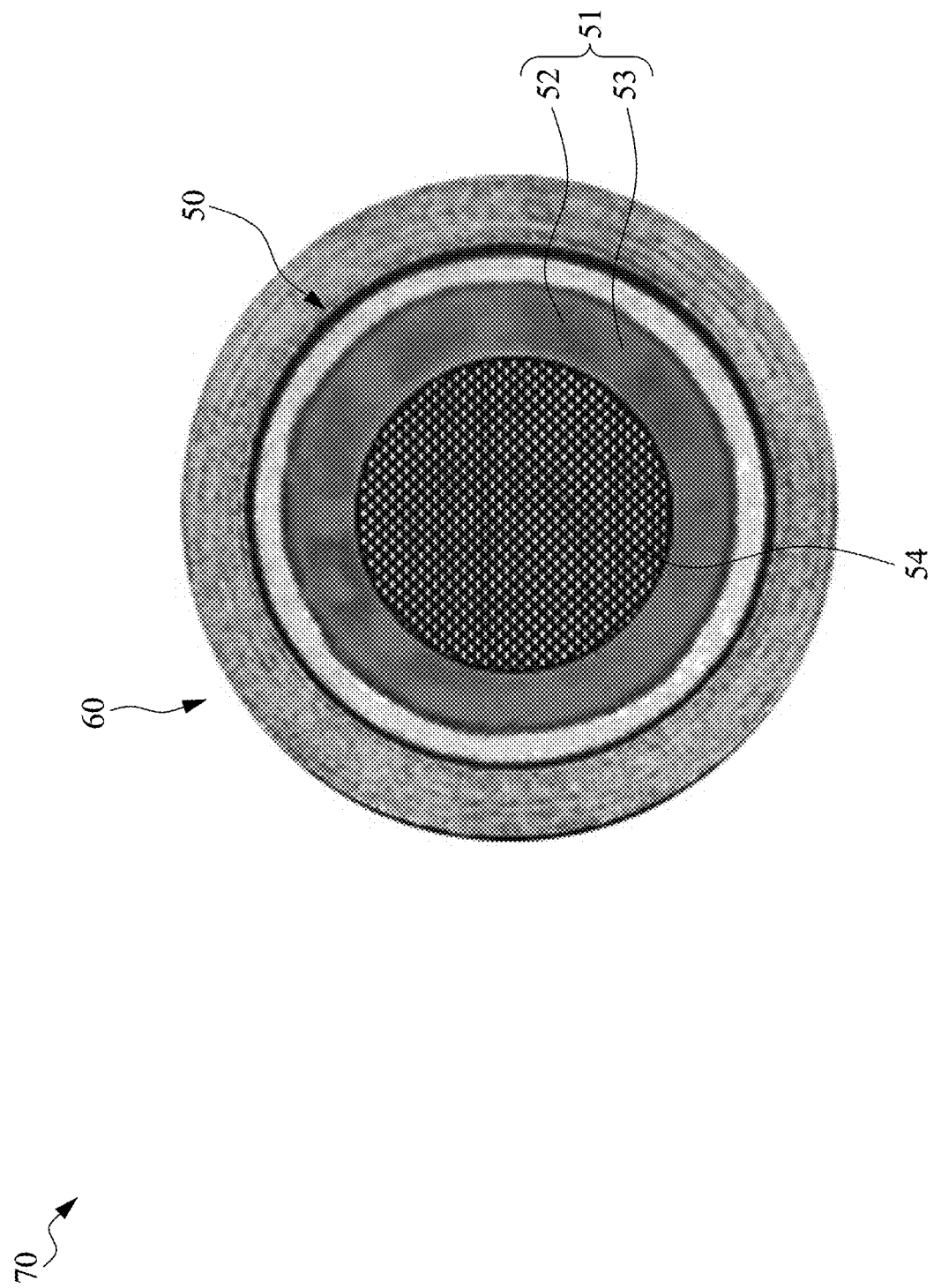
FIG. 10 is a top view of a comparative package structure.

FIG. 10 is a top view of a package structure 70 according to some comparative embodiments. The comparative package structure 70 may be produced by manufacturing methods as shown in FIG. 9A and FIG. 9B except that the arrangement of the vacuum conduit(s) is changed. In the method for manufacturing the package structure 70 according to FIG. 10, a plurality of vacuum conduits 422 are arranged around the periphery of the film attaching assembly 42 and are aligned with the attachment region 51 (discussed below) during the film attachment operation.

The comparative package structure 70 may include the film 50 and the electronic device 60. The electronic device 60 may have the same or similar configuration as the electronic device 20. The film 50 may include an attachment region 51 and a gas permeable region 54. The attachment region 51 may be attached to the upper surface of the electronic device 60 (or the upper surface of the lid of the electronic device 60). The gas permeable region 54 may cover the opening (or an aperture) of the lid of the electronic device 60 and allow air or gases to pass through. However, after attaching the film 50 to the electronic device 60, the upper surface of the film 50 may contain certain unevenness due to the suction force, which adversely affects the adhesion between the film 50 and the electronic device 60 as well as the performance of the electronic device 60. Specifically, as shown in FIG. 10, the attachment region 51 of the film 50 contains a first portion 52 (shown in dark gray) and a second portion 53 (shown in light gray). An upper surface of the film in the first portion 52 contacts the lower surface of the film attaching assembly 42 and receives the pressure therefrom. A lower surface of the film in the first portion 52 is attached to the upper surface of the electronic device 60 (or the upper surface of the lid of the electronic device 60) under the pressure applied by the film attaching assembly 42. The second portion 53 is aligned with the vacuum conduit of the film attaching assembly 42. To have better adhesion between the film 50 and the electronic device 60, it is desirable to enlarge the contact area therebetween, i.e., the area of the first portion 52 of the film 50. However, the area of the second portion 53 of the film 50 will decrease when the area of the first portion 52 of the film 50 increases, which leads to the decrease in the suction force and results in the failure of the pick-up operation. In addition, since the first portion 52 of the film 50 receives a downward pressure while the second portion 53 of the film 50 receives the suction force from the film attaching assembly 42, the film 50 is liable to deform. As a result, the upper surface of the film may contain certain unevenness and the adhesion between the film 50 and the electronic device 60 and the performance of the electronic device may be deteriorated.

In another comparative method for attaching a film or manufacturing a package structure, a stamping saw is utilized to cut a film into a predetermined size, and the cut film is attached to the lid of an electronic device by the pressure provided from the stamping saw. However, the lid may be damaged by the stamping saw. Further, when the stamping saw is blunted, a residue of the film may remain on the blunted stamping saw, which degrades the quality of the film. Moreover, the cycle time is increased because of replacement of blunted stamping saw with a new stamping saw.

Unlike the comparative examples, the method according to the present disclosure does not need to utilize the suction for picking the film up from the carrier tape and the pressure can be applied to the upper surface of the film 30 more evenly. As a result, an upper surface of the film 30 is relatively flat (or substantially flat) and the adhesion between the film 30 and the electronic device can be improved. Thus, the package structure 2 may have better reliability and performance. Further, in the comparative manufacturing processes shown in FIG. 9A and FIG. 9B, the process time of picking up the film 50 by the film attaching assembly 42 may be relatively long, which may have a negative impact on the cycle time of manufacturing package structures. In comparison with the comparative manufacturing processes, the embodiments of the present disclosure may provide a package structure with better performance and facilitate mass-production of package structures with a reduced cycle time.

Figure 11:
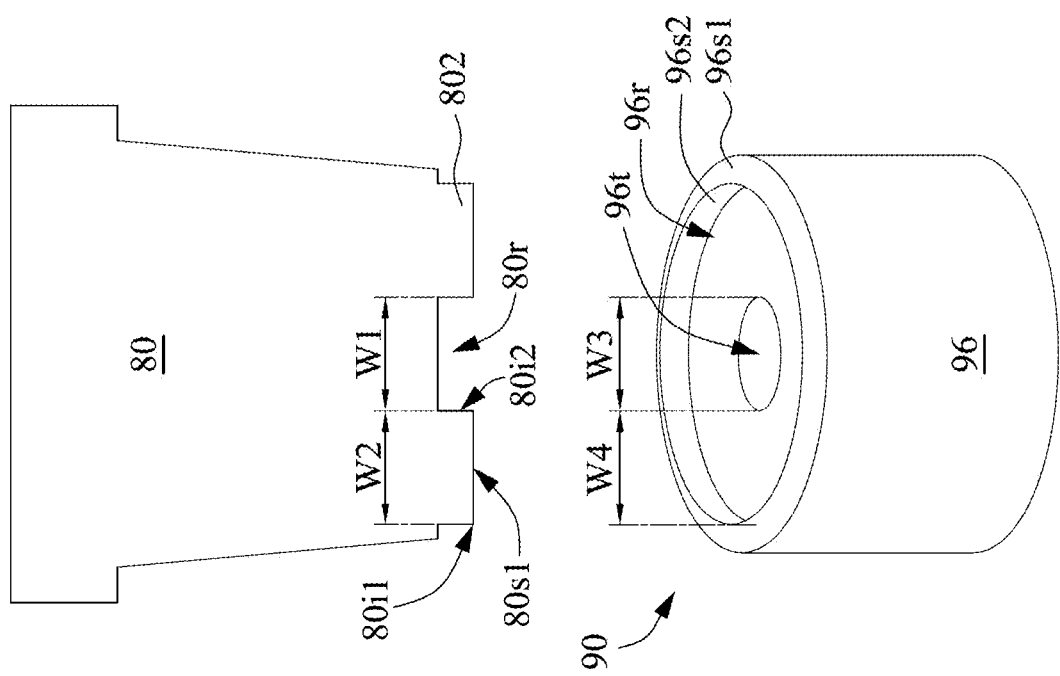
FIG. 11 illustrates a cross-sectional view of an electronic device and a film attaching assembly.

FIG. 11 illustrates a cross-sectional view of a film attaching assembly 80 and an electronic device 90. In some embodiments, the film attaching assembly 80 may have a surface 80s1, which is configured to apply pressure to attach a film (e.g., the film 30 as shown in FIG. 8A and FIG. 8B) to the electronic device 90. In some embodiments, the film attaching assembly 80 may have a protruded portion 802 and a recess 80r surrounded by the protruded portion 802, both of which face the electronic device 90. The surface 80s1 of the film attaching assembly 80 locates on the protruded portion 802 and contacts the attachment region of the film when carrying out the film attachment operation. The recess 80r may have a dimension W1, which is defined as a diameter of the recess 80r. The protruded portion 802 may have a dimension W2, which is defined as a distance between an outer edge 80i1 of the surface 80s1 and an edge 80i2 of the recess 80r. In some embodiments, the film attaching assembly 80 may be applicable to manufacturing processes as shown in FIG. 1A to FIG. 7. For example, at the stages as shown in FIG. 4 and FIG. 5, the protruded portion 802 may provide a first pressure to the attachment region (e.g., the attachment region 32 shown in FIG. 8B) of the film 30. A second pressure may be applied to the gas permeable region (e.g., the gas permeable region 34 shown in FIG. 8B) of the film 30. In some embodiments, the second pressure is less than the first pressure. In some embodiments, the second pressure is substantially equal to 0. In some embodiments, the film is moved toward the electronic device before applying the first pressure, the first pressure is applied until the film is attached to the electronic device, and the film is separated from the carrier tape after stopping applying the first pressure.

The electronic device 90 may include a lid 96. The lid 96 may have a surface 96s1 (or an upper surface) and a recess 96r recessed from the surface 96s1 of the lid 96. The lid 96 further include a surface 96s2 (or a sidewall) connected to the surface 96s1. The recess 96r of the lid 96 may be configured to accommodate a film. In some embodiments, the electronic device 90 may define an opening 96t locating in the recess 96r. The opening 96t may be connected to an inner space of the electronic device 90, thereby communicating the inner space and external environment. The electronic device 90 may have a dimension W3, which may be defined as a diameter of the opening 96t. The electronic device 90 may have a dimension W4, which may be defined as a distance between the surface 96s2 of the lid 96 and an edge of the opening 96t.

In some embodiments, the dimension W1 of the film attaching assembly 80 may be substantially equal to the dimension W3 of the electronic device 90. In some embodiments, the dimension W2 of the film attaching assembly 80 may be substantially equal to the dimension W4 of the electronic device 90. Further, in some embodiments, the protruded portion 802 of the film attaching assembly 80 may correspond to the attachment region of a film (e.g., the attachment region 32 of the film 30 as shown in FIG. 8B). In some embodiments, the recess 80r of the film attaching assembly 80 may correspond to the gas permeable region of a film (e.g., the gas permeable region 34 of the film 30 as shown in FIG. 8B). When the film attaching assembly 80 has such a configuration, the attachment region of a gas permeable film may be attached to the electronic device 90 tightly without degrading the gas permeability of the gas permeable region.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. Such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of attaching a film, comprising:
providing a carrier tape supporting a film over a surface of the carrier tape;
moving the film to a position over an electronic device;
attaching the film to the electronic device;
applying a first pressure on a first region of the film; and
applying a second pressure on a second region of the film, wherein the first pressure is greater than the second pressure.

2. The method of claim 1, wherein the second pressure is substantially equal to 0.

3. The method of claim 1, wherein the first region is around the second region.

4. The method of claim 1, wherein from a top view perspective, the second region overlaps an aperture of the electronic device.

5. The method of claim 1, further comprising:
moving the film toward the electronic device before applying the first pressure.

6. The method of claim 5, further comprising:
moving the carrier tape toward the electronic device.

7. The method of claim 1, further comprising:
stopping applying the first pressure after the film is attached to the electronic device.

8. The method of claim 1, further comprising:
separating the film from the carrier tape after stopping applying the first pressure.

9. The method of claim 1, wherein the electronic device provides a supporting force and wherein the supporting force and the first pressure are collectively configured to compress the film.

10. The method of claim 1, further comprising:
moving the electronic device toward the film.

11. The method of claim 6, further comprising:
attaching the film to an upper surface of the electronic device.

12. The method of claim 6, further comprising:
aligning the film with a recess of an upper surface of the electronic device.

13. The method of claim 12, further comprising:
applying a pressure on the film so that the film is attached to the recess of the upper surface of the electronic device.

14. A method of attaching a film, comprising:
providing a carrier tape supporting a film over a surface of the carrier tape;
moving the film to a position over an electronic device; and
attaching the film to the electronic device, wherein the film has a first side configured to be attached to the carrier tape and a second side configured to be attached to the electronic device, wherein an adhesion of the first side is less than an adhesion of the second side.

15. The method of claim 10, wherein after moving the electronic device toward the film, the electronic device is at an elevation higher than other electronic devices.

16. The method of claim 10, further comprising:
making the carrier tape be in contact with the electronic device and be in no contact with a second electronic device.

17. The method of claim 14, further comprising:
moving a film attaching assembly to apply a pressure on the first side of the film so that the second side of the film is in contact with the electronic device.

18. The method of claim 14, wherein the film attaching assembly moves vertically to apply a pressure on the carrier tape.

* * * * *